(12) United States Patent
Vartiovaara

(10) Patent No.: US 8,013,609 B2
(45) Date of Patent: Sep. 6, 2011

(54) DETUNING CIRCUIT AND DETUNING METHOD FOR AN MRI SYSTEM

(75) Inventor: Ville P. Vartiovaara, Espoo (FI)

(73) Assignee: Koninklijke Philips Electronics N.V., Eindhoven (NL)

( * ) Notice: Subject to any disclaimer, the term of this patent is extended or adjusted under 35 U.S.C. 154(b) by 75 days.

(21) Appl. No.: 12/519,790

(22) PCT Filed: Dec. 17, 2007

(86) PCT No.: PCT/IB2007/055166
§ 371 (c)(1),
(2), (4) Date: Jun. 18, 2009

(87) PCT Pub. No.: WO2008/078270
PCT Pub. Date: Jul. 3, 2008

(65) Prior Publication Data
US 2010/0039113 A1  Feb. 18, 2010

(30) Foreign Application Priority Data
Dec. 21, 2006  (EP) .................................... 06126808

(51) Int. Cl.
*G01V 3/00* (2006.01)

(52) U.S. Cl. ........................ 324/322; 324/318
(58) Field of Classification Search .................. 324/322, 324/318
See application file for complete search history.

(56) References Cited

U.S. PATENT DOCUMENTS

| 5,258,718 | A | * | 11/1993 | Duerr ............................ 324/322 |
| 5,260,658 | A | * | 11/1993 | Greim et al. .................. 324/322 |
| 6,414,488 | B1 | | 7/2002 | Chmielewski |
| 6,469,509 | B2 | * | 10/2002 | Friedrich et al. ............. 324/318 |
| 6,850,067 | B1 | | 2/2005 | Burl et al. |
| 7,538,554 | B2 | * | 5/2009 | Wendt et al. .................. 324/322 |
| 2004/0100260 | A1 | | 5/2004 | Jevtic et al. |

FOREIGN PATENT DOCUMENTS

| DE | 4422069 | 9/1995 |
| EP | 1130413 | 9/2001 |
| WO | WO2005057232 | 6/2005 |

* cited by examiner

*Primary Examiner* — Louis Arana

(57) ABSTRACT

The present invention relates to a magnetic resonance imaging system and a corresponding method having a transmit phase and a receive phase. Further, the present invention relates to a detuning circuit and a corresponding detuning method for detuning an RF receive coil during the transmit phase in such a magnetic resonance imaging system. In high-field MRI systems the transmit mode operating frequency is higher than normal high breakdown voltage rectifiers can handle when they are used to forward bias a passive detuning circuit PIN diode switch. The proposed circuit uses a current-limiting capacitor (C5) in series with a fast (e.g. schottky) rectifier diode (V2) with a reverse breakdown voltage of e.g. 20 volts and a fast reverse recovery time to generate a DC current. The rectifying circuit is isolated from the PIN diode (V1) with a relatively high-value inductor (L2), which ensures that no harmful transient current spikes can flow from the PIN diode anode to the rectifying circuit. The inductor (L2) still passes and maintains the DC current generated by the rectifying circuit through the PIN diode, thus enabling the robust forward-biasing of the PIN-diode during transmit mode. The use of a fast (and thus low-power) rectifier results in less dissipation on the detuning circuit, and helps in fulfilling the surface temperature limits posed on receiver coils.

12 Claims, 6 Drawing Sheets

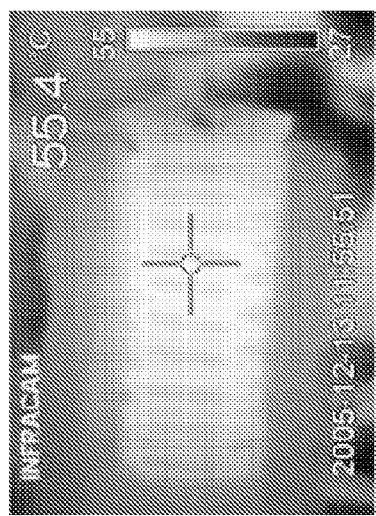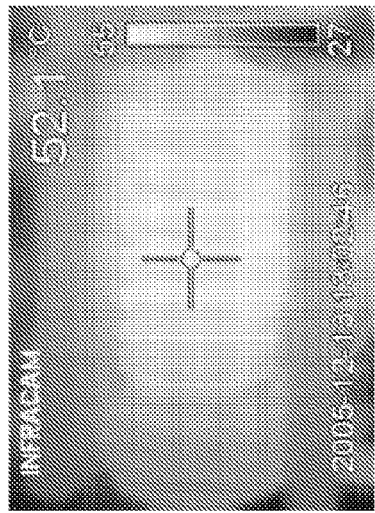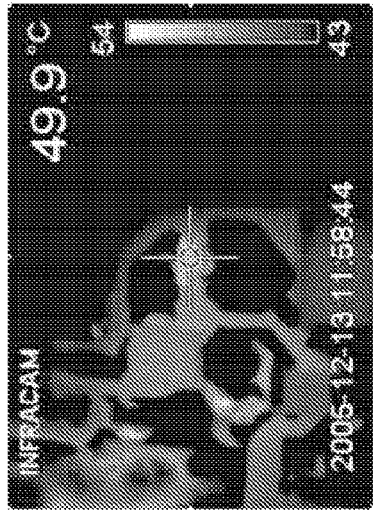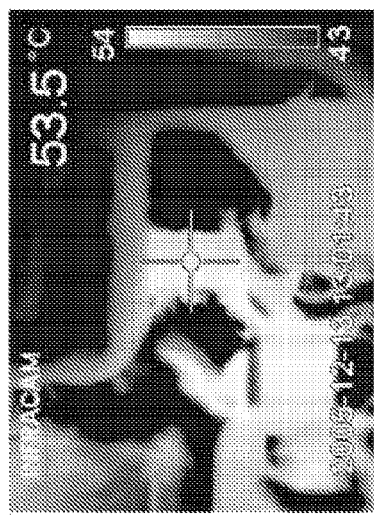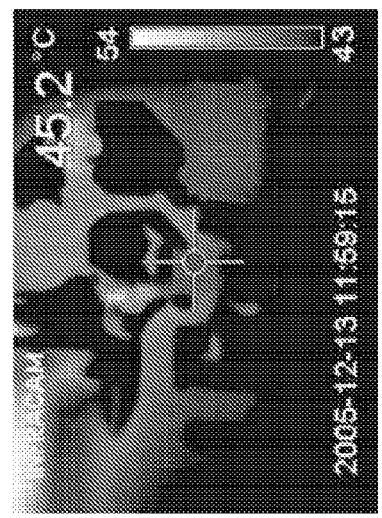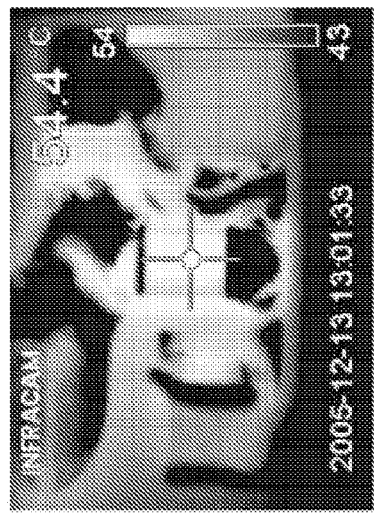
FIG. 7
FIG. 8

DETUNING CIRCUIT AND DETUNING METHOD FOR AN MRI SYSTEM

FIELD OF THE INVENTION

The present invention relates to a magnetic resonance imaging system and a corresponding method having a transmit phase and a receive phase. Further, the present invention relates to a detuning circuit and a corresponding detuning method for detuning an RF receive coil during the transmit phase in such a magnetic resonance imaging system.

BACKGROUND OF THE INVENTION

Magnetic resonance imaging (MRI) devices apply a main magnetic field through an examination region. This strong field, typically denoted $B_0$, acts to align the nuclei within a subject to be examined. In some MRI devices, the $B_0$ field is horizontally oriented, and in others it is vertically oriented.

In both horizontally and vertically oriented systems, magnetic resonance is excited in the aligned nuclei by a relatively strong orthogonal RF (radio frequency) field, typically denoted $B_1$. The $B_1$ field causes the aligned nuclei or spins to tip into a plane orthogonal to the static magnetic field $B_0$. Over time, the spins realign themselves with the $B_0$ field emitting relatively weak RF resonance signals as they precess. This resonance is detected by RF coils tuned to the specific resonance frequency desired. These resonance signals are passed to image processing equipment to reconstruct the signals into an image representation for display on a video monitor.

Typically, the transmit RF signals are orders of magnitude larger than the magnetic resonance signals generated by the excited nuclei and detected by the RF receive coils. To maintain patient safety and to protect the sensitive receiver equipment including the coils, the receive coils are typically decoupled or detuned during the transmit phase of an imaging procedure. Accordingly, it is known to decouple receive coils using semiconductor switches or PIN diodes in conjunction with LC circuitry using one of two principal variants, namely active decoupling and passive decoupling.

With active decoupling, during the transmit phase of an imaging operation a bias is applied to a PIN diode semiconductor switch in conjunction with an LC circuit to decouple or detune the coil. As technology has improved and the power of the transmit RF pulses has increased, increasingly higher bias currents on the switching diodes have been used to ensure the receiver coil remains decoupled. Unfortunately, these higher bias currents—in addition to increasing design complexity and heat dissipation in DC supply lines—introduce magnetic field distortions in the $B_0$ field close to the subject degrading the image obtained.

With passive decoupling, antiparallel diode semiconductor switches in conjunction with LC circuitry are also employed. In this method, antiparallel combinations of high speed switching diodes decouple the coil in response to the transmit pulse itself. In other words, when the antiparallel combination of diodes is exposed to the high power transmit signal, each diode conducts during its respective half cycle. This allows high currents, but not low currents, to see a parallel resonant LC circuit which decouples the coil. While this method employs no bias currents and eliminates the associated $B_0$ field distortions, the coil is always decoupled during the RF transmit pulse and always coupled or active during receive.

A receiver coil in a magnetic resonance imaging system is a sensitive antenna, whose function is to receive the electromagnetic signal originating in the patient's tissue during an imaging sequence. However, in order to get this echo signal, the system first emits a strong electromagnetic pulse, that carries energy to the protons in the tissue. This pulse also couples to the receiver coil, which has negative impacts: 1) the pulse is affected, which degrades the image quality, 2) induced voltages in the receive coil may generate electromagnetic fields risking patient safety, and 3) induced voltages may break the receiver coil. It is required that the patient safety must not be compromised due to the presence of the coil, independent of it being connected to the system or not.

To minimize the abovementioned coupling of the transmit pulse, the receiver coil contains specific detuning circuits, whose function is to decouple the receiver antenna loops from the emitted transmit pulse. The detuning circuitry must be such that is prevents the transmit pulse from coupling, but doesn't degrade the receiving performance of the coil too much.

In order for the coil to remain safe even when it is left unconnected, at least a part of the detuning circuitry needs to be passive, i.e. it must keep the receiver coil safe to the patient without system control. However, during normal operation, passive detuning circuits can be suboptimal in image quality point of view, and thus also active detuning is usually implemented in the coil, or the passive detuning circuitry can also be actively controlled by the system when the coil is connected.

Several methods of realizing a detuning circuit are presented in U.S. Pat. No. 6,850,067. A detuning circuit is a parallel resonance circuit that is connected in series with an MRI (Magnetic Resonance Imaging) receiver coil antenna loop. The circuit creates high impedance to the current flowing in the antenna loop, thus decoupling the antenna from the surrounding electromagnetic field. While this is favorable only during the transmit pulse, the parallel resonance circuit must be such that it can be disabled (made low-impedance) during the receiving period. This can be done with a PIN diode connected in series with one of the resonance circuit components, such that only when the PIN diode is conducting, the resonance circuit is in the high-impedance state. The PIN diode can be driven conductive either with an auxiliary DC current supply (active detuning circuit) or an internal circuit that utilizes the transmit field energy to forward bias the PIN diode (passive detuning circuit).

In a passive detuning circuit, the biasing current of the PIN diode is generated by taking some RF power from the current flowing through the detuning circuit and converting it to a DC current flowing through the PIN diode. Depending on the design of the circuitry that does this conversion, the biasing current might be too low or unstable to maintain the PIN diode series resistance low enough. If the forward bias is not high enough or is intermittent, the PIN diode starts to dissipate more heat and also degrade the overall performance of the detuning circuit. Due to this, the conversion circuit must be as efficient as possible.

The simplest solution to feeding a DC current through the PIN diode is to connect a high-speed rectifier diode antiparallel to the PIN diode, so that when the PIN diode is not conducting, the negative phase of the current flows via the rectifying diode, thus creating an average positive current flowing through the PIN diode. The paradox is that if the PIN diode was driven perfectly conductive, no RF voltage would be seen across the antiparallel rectifier diode, and thus no current would flow via this rectifying diode, and no forward-biasing DC current would flow through the PIN-diode. As a conclusion, the PIN diode would continuously be balancing between the non-conducting and conducting state, thus dissipating more than necessary.

Some of the solutions explained in U.S. Pat. No. 6,850,067 use a way of getting the RF current not from across the PIN diode, but across the whole detuning circuit. In this way, the better the detuning circuit works (PIN diode conducts well), the higher the voltage available across the detuning circuit terminals and thus the rectifying circuitry. The current is drawn through a current-limiting capacitor to a rectifier pair, which creates the DC current for the PIN diode. The idea is good in theory, but realistically not implementable. The two rectifying diodes in series are connected antiparallel to the PIN diode, effectively exposing them to the same conditions as the single rectifier diode used in the simplest solution explained above in the beginning. Thus no existing fast rectifier can be used due to their low power and reverse voltage handling capabilities.

SUMMARY OF THE INVENTION

It is an object of the present invention to provide a detuning circuit and method for an MR imaging system as well as an MR imaging system and method, enabling the creation of a DC feeding circuit having the same advantage of the above-mentioned circuit of being able to deliver enough DC current through the PIN diode while also being implementable in high-field MRI systems using fast low-voltage rectifier components.

The object is achieved according to the present invention by a MRI system comprising
a) a main magnetic field generator for generating a main magnetic field through an imaging region;
b) a gradient field generator for generating magnetic field gradients across the main magnetic field;
c) a radio frequency transmitter coil for selectively transmitting an RF transmit pulse having a resonance frequency spectrum through the imaging region during the transmit phase, exciting nuclei in the imaging region to generate magnetic resonance signals in the resonance frequency spectrum;
d) an RF receive coil, adapted to resonate in the resonant frequency spectrum, for receiving magnetic resonance signals during the receive phase; and
e) a detuning circuit for detuning the RF receive coil during the transmit phase, the detuning circuit including
e1) a resonance circuit including a detuning capacitor and a detuning inductor;
e2) a PIN diode coupled in series to said detuning inductor and together with said detuning inductor in parallel communication with said detuning capacitor for enabling or disabling the resonance circuit;
e3) a bias current generating circuit for generating a DC bias current through the PIN diode during the transmit phase including:
e31) a rectifier coupled, with the same serial polarity, in parallel to the PIN diode,
e32) a current limiting circuit coupled in series to said rectifier and together with said rectifier in parallel communication with said detuning capacitor for passing a small current through the rectifier, and
e33) a reactive circuit coupled between the common node of the detuning inductor and the PIN diode and the common node of the rectifier and the current limiting circuit for passing a DC current between said common nodes.

The object is further achieved according to the present invention by a corresponding MRI method as disclosed herein and a corresponding detuning circuit and method, and computer program as disclosed herein.

The computer program of the invention can be provided on a data carrier such as a CD-rom disk, or the computer program of the invention can be downloaded from a data network such as the worldwide web. When installed in the computer included in a magnetic resonance imaging system the magnetic resonance imaging system is enabled to operate according to the invention.

Preferred embodiments of the invention are defined herein.

The proposed circuit uses a current-limiting capacitor in series with a fast (e.g. schottky) rectifier diode with a reverse breakdown voltage of e.g. 20 volts and a fast reverse recovery time to generate a DC current. The rectifying circuit is isolated from the PIN diode with a relatively high-value inductor, which ensures that no harmful transient current spikes can flow from the PIN diode anode to the rectifying circuit. The inductor still passes and maintains the DC current generated by the rectifying circuit through the PIN diode, thus enabling the robust forward-biasing of the PIN-diode during transmit mode. The use of a fast (and thus low-power) rectifier results in less dissipation on the detuning circuit, and helps in fulfilling the surface temperature limits posed on receiver coils.

This present invention deals with improving the performance of the passive detuning circuit by enabling it to work with less dissipated heat and get activated at a lower incident transmit power level compared to a conventional design. The former improves the robustness of the coil design against excessive transmit pulse power, the latter improves the detuning circuit performance when it is relied upon in normal imaging and not just for safety. This improvement comes from the lowered transmit field distortion due to a lower requirement of transmit field strength for activation.

BRIEF DESCRIPTION OF THE DRAWINGS

The invention will now be explained in more detail with reference to the drawings in which FIG. 7 shows IR images of the new circuit in steady state, FIG. 8 shows IR images of a known circuit built on the PCB of the new design in steady state.

DETAILED DESCRIPTION OF EMBODIMENTS

Figure 1:
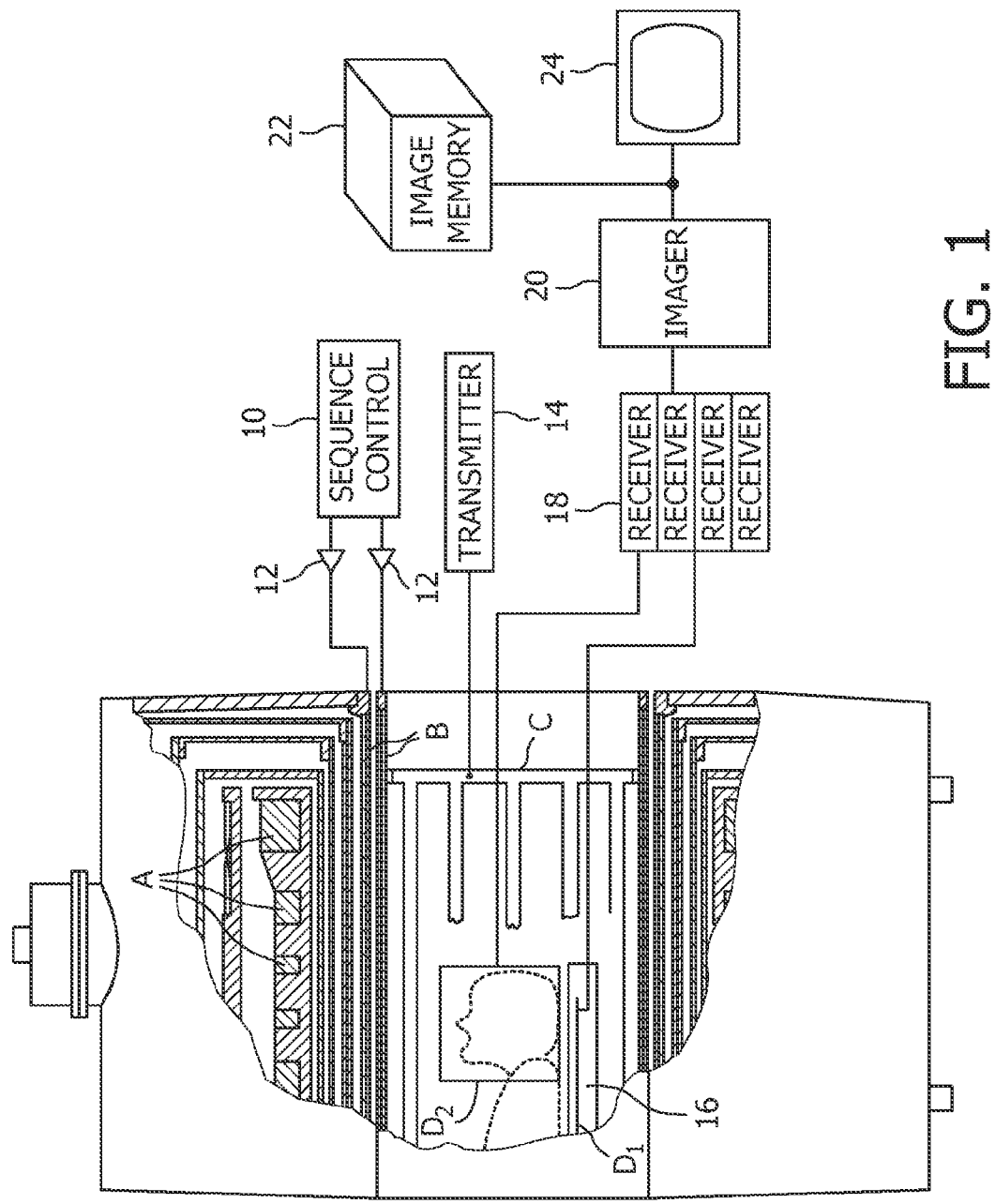
FIG. 1 is a diagrammatic illustration of a magnetic resonance imaging apparatus incorporating the present invention.

With reference to FIG. 1, a magnetic resonance imaging apparatus includes a main magnetic field generator A for establishing a temporally constant, main magnetic field $B_0$ through an examination region. Gradient magnetic field coils B selectively produce magnetic field gradients transversely across the main magnetic field of the imaging region. An RF transmitter coil C, selectively transmits radio frequency resonance excitation and manipulation pulses during a transmit portion of each transmit/receive cycle. These high power excitation and manipulation pulses excite magnetic resonance in the nuclei of the subject disposed in the imaging region. The resonating nuclei generate radio frequency signals of a frequency which is determined by the strength of the magnetic field and other variables such as the specific nuclei targeted. A magnetic resonance imaging sequence controller 10 is functionally connected to drivers 12 for the gradient coils B and a transmitter 14 for driving the transmit coil C. The sequence control 10 coordinates the generation of, and sequencing for, the gradient and resonance exciting pulse.

In the illustrated embodiment, a first receive coil $D_1$, is semi-permanently embedded within the movable patient couch 16, while a second receive coil $D_2$ is selected and placed in the imaging area only when desired. During a receive portion of each transmit/receive cycle, a selected one of the receive coils, for example $D_2$, passes received RF signals to a receiver 18. An imager 20, such as a two-dimensional Fourier transform imaging processor, reconstructs one or more electronic image representations from the received radio frequency signals that are stored in an image memory 22. Typically, the electronic images are representative of density, position, relaxation time, and other characteristics of the resonating nuclei in each voxel of the imaging volume. A video monitor, flat panel display, or other human readable display mechanism 24 converts portions of the electronic image representation to human readable images.

While the magnetic resonance imaging system has been described with respect to a single frequency horizontally oriented magnetic resonance imaging system, those skilled in the art will appreciate that the principles disclosed are equally applicable to multi-frequency systems, vertically oriented systems, off-axis coils, and the like.

Figure 2:
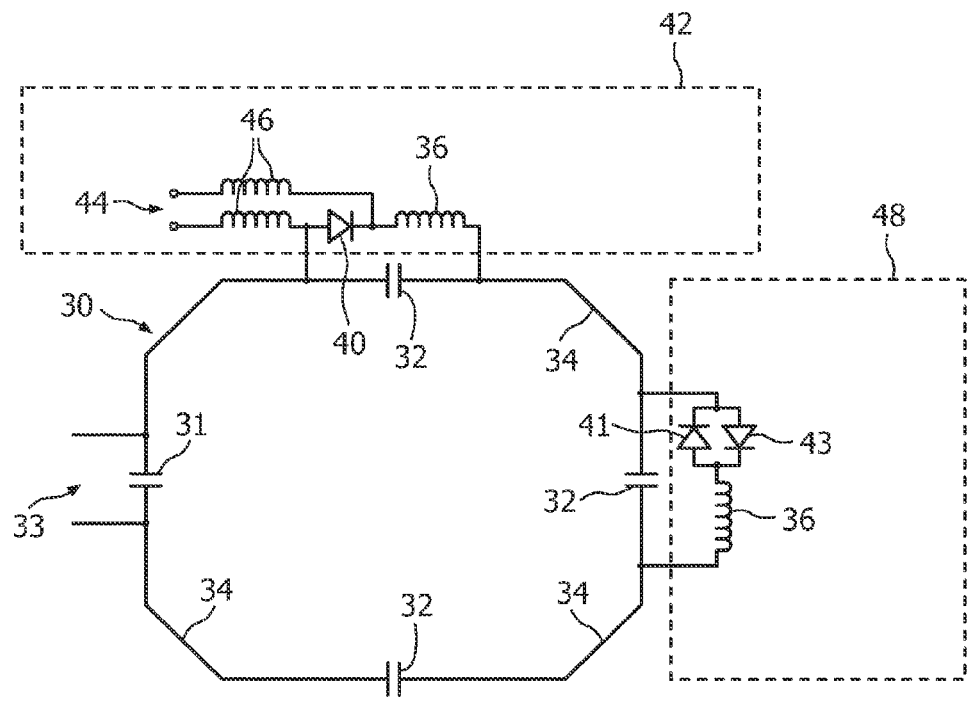
FIG. 2 is a schematic diagram of a prior art MRI coil with active and passive detuning circuits.

Referring to FIG. 2 showing a known detuning circuit, a MRI RF coil 30 includes tuning capacitors 32 connected between coil traces 34 and a matching capacitor 31 at the input to the receiver 33. Detuning inductors 36 are switched into parallel with the capacitors 32 during a transmit pulse. The tuning capacitors 32 and detuning inductors 36 in the coil 30 are made to form parallel resonant circuits of high impedance, for "blocking" current flow in the coil 30. The losses found in the passive decoupling circuit 38 not only creates heat during transmit but also reduces the "blocking" impedance compared with an ideal switch.

The active PIN diode 40 (or other diode having sufficient stored charge) of the active PIN-diode detuning circuit 42 remains conducting for a whole cycle of the RF waveform because the stored charge in the junction does not get depleted during the period of reverse current flow. This is normally achieved by a small DC current supplied in advance of the RF waveform. This of course requires the DC bias supply 44 supplying a DC current via RF chokes 46. In the passive detuning circuit 48 two parallel fast switching diodes 41 and 43 are provided in series to the detuning inductor 36.

Figure 3:
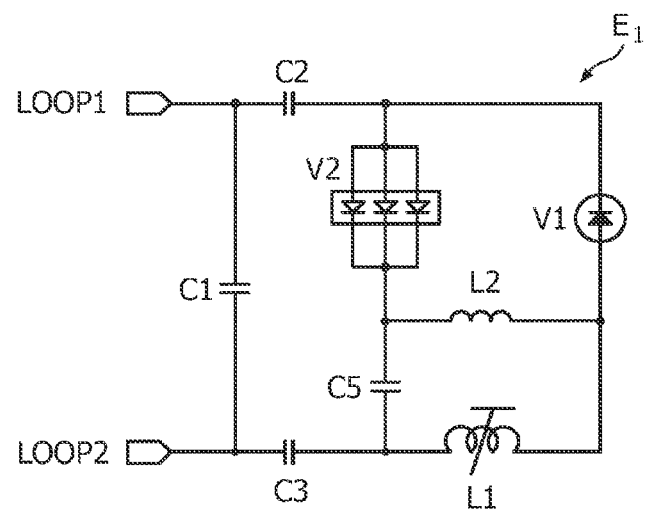
FIG. 3 shows a first embodiment of a detuning circuit according to the present invention.

FIG. 3 shows a first embodiment of the circuit topology of a detuning circuit $E_1$ as proposed according to the present invention. This circuit comprises:
a) A parallel resonance circuit formed by a capacitor C1 and an inductor L1;
b) A PIN diode V1 that enables or disables the resonance circuit;
c) A circuit that generates a DC bias current through the PIN diode during transmit pulse, including:
c1) A fast low-power rectifier V2;
c2) A current limiting small-valued capacitor C5 that passes a small current through the rectifier V2;
c3) A relatively large-valued, low-power inductor L2, that passes a DC current from the common node of the rectifier and the current-limiting capacitor C5 to the proper node of the PIN diode V1;
c4) Optional DC-blocking capacitors C2 and C3.

Preferably, in a practical implementation, V2 is a triple low-power schottky diode and V1 is the high-power PIN diode. L1 is the high-power inductor that forms the resonance circuit with C1 when V1 is conducting, and L2 is the DC-feeding inductor.

The invention can also be applied to an active detuning circuit to provide a passive back-up mode in case the active control is unable to work (e.g. an unplugged coil on the couch). The circuit $E_2$ for this implementation is similar to the circuit shown in FIG. 3, with the addition of a few components (see FIG. 4):
An RF-blocking filter comprising inductors L3 and L4 and a capacitor C7;
A DC connection, e.g. a connector Y1;
An optional current-limiting resistor R1.

Figure 4:
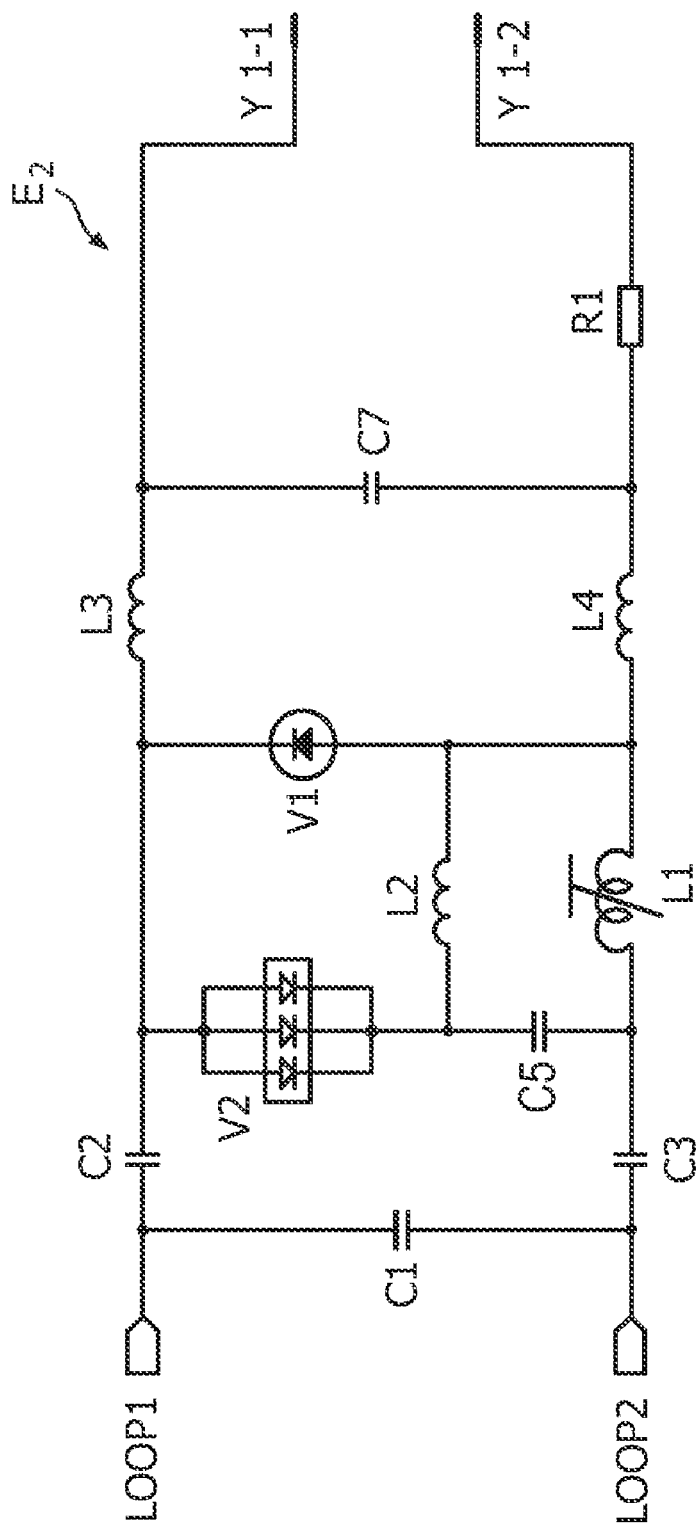
FIG. 4 shows a second embodiment of a detuning circuit according to the present invention.

In the embodiment of the active-passive detuning circuit shown in FIG. 4 V2 is a triple low-power schottky diode that is fed by the small current-limiting capacitor C5, and V1 is the high-power PIN diode. L1 is the high-power inductor that forms the resonance circuit with C1 when V1 is conducting, and L2 is the DC-feeding inductor. The possible active control current is applied on the right side connectors through the filter formed by L3, L4 and C7 and the optional current-limiting resistor R1. C2 and C3 are optional DC-blocking capacitors.

Figure 5:
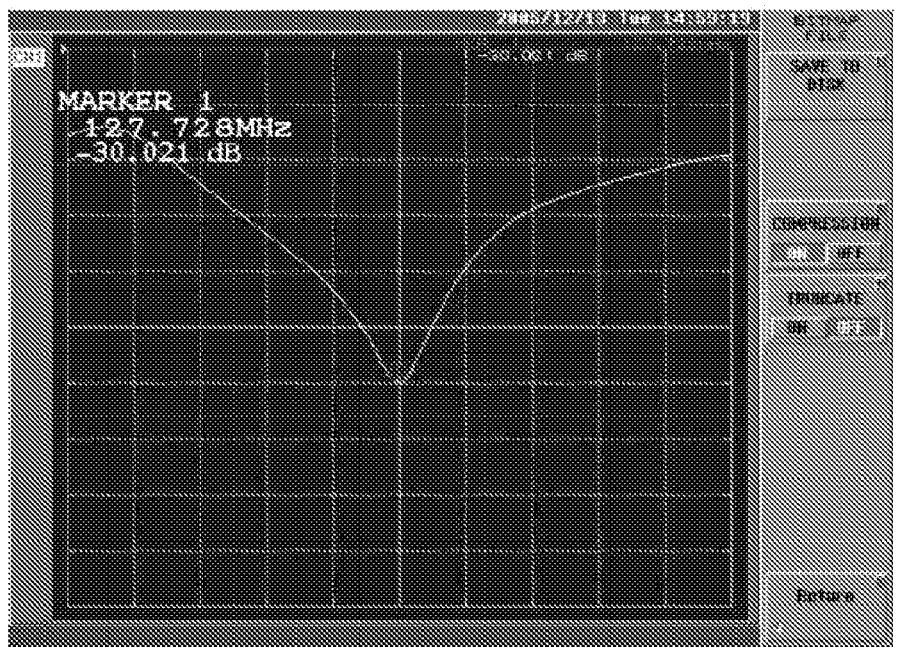
FIG. 5 shows the attenuation of the circuit according to the present invention.
Figure 6:
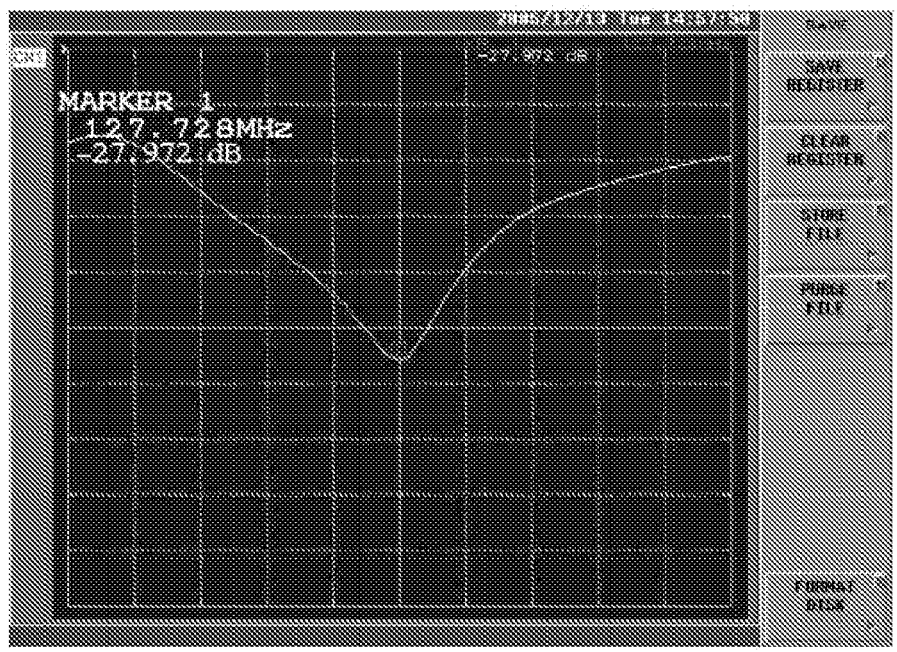
FIG. 6 shows the attenuation of a known circuit built on a PCB of the new design.

FIGS. 5 and 6 show pictures illustrating that the attenuation obtainable from a design utilizing the present invention ("new design") is at least as high as with known designs. In particular, FIG. 5 shows the attenuation of the circuit according to the present invention (new design) and FIG. 6 shows the attenuation of a known circuit (old design) built on the printed circuit board (PCB) of the new design.

FIGS. 7 and 8 show thermal images of a design utilizing the present invention compared to a known design under the same conditions. In particular, FIG. 7 shows IR images of the new design in steady state (>30 min, free convection). From left to right are shown PIN diode V1, schottky diode V2, power inductor L1. FIG. 8 shows IR images of a known design built on the PCB of the new design in steady state (>30 min, free convection). From left to right are shown PIN diode, rectifying diode, power inductor.

These images show that, when compared to a known design, the most dissipation is due to the resistance of the power inductor, while in the known design the PIN diode heats up most. This means that the PIN diode in the known design isn't conducting perfectly, while in the design utilizing the present invention the PIN diode conducts well and thus the total dissipation is much less.

What makes the present invention different from the existing circuits is that
a) the DC current is generated independent of the PIN diode state, i.e. even when the voltage across the PIN diode is low (the diode is conducting well), the DC current is still generated, thus maintaining the well-conducting state;
b) the DC-generating circuit can utilize fast components because they are not exposed to a high voltage or current, especially when the PIN diode is not yet conducting;
c) a) and b) are applied at the same time.

The benefit from the abovementioned differences to known circuits is that the Q value of the resonance circuit forming the detuning circuit is effectively higher, thus causing less dissipation. The highest amount of dissipation is caused by the resistance of the power inductor, while in the known circuits it is due to the poorly conducting PIN diode.

As explained and illustrated above, important elements of the present invention according to the above described embodiment are:

The rectifier circuit is separated from the PIN diode circuit, thus enabling the use of a low-voltage rectifier.

The possibility to use a low-voltage rectifier makes the PIN diode drive more solid, which contributes to lower heat dissipation. This in turn increases safety and helps coil design.

The PIN diode bias current is generated from across the whole detuning circuit instead of the PIN-diode, thus enabling more continuous drive of the PIN diode.

Figure 9:
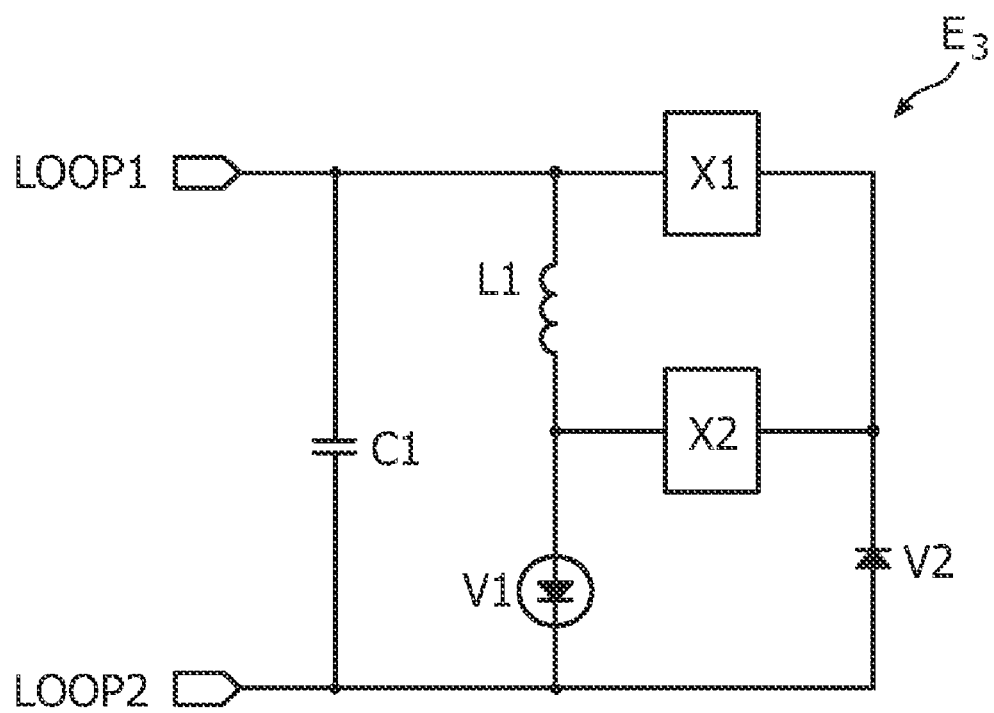
FIG. 9 shows a third embodiment of a detuning circuit according to the present invention.

FIG. 9 shows a further, more general embodiment of the detuning circuit $E_3$ according to the present invention. The circuit consists of a traditional parallel detuning circuit including an inductor L1, a capacitor C1 and a switch PIN diode V1. In active mode, the diode V1 is controlled by means of an external source connected across it. When in passive mode, a similar control is realized by means of a circuitry that uses a part of the power flowing through the detuning circuit to control the switch diode V1. The power is withdrawn by means of a non-linear rectifying circuit V2 that is separated from the V1 terminals with a linear (essentially reactive) circuit X2, whose purpose is to protect the non-linear rectifying circuit from malicious voltage spikes incident at the diode V1 terminals. This linear circuit X2 also limits the current flowing between the rectifying circuit and the diode V1 to a suitable level. The rectifying circuit in turn gets its power from across the series-connected pair consisting of V1 and L1, and is again protected by a linear (essentially reactive) circuit X1 against extraneous current. This linear circuit X1 also acts as a limiter in a sense that it ensures that only just enough of the power available in the detuning circuit is utilized for the V1 control, thus limiting the deterioration of detuning efficiency to a minimum and still providing enough current for the rectifying circuitry to control the switch diode V1.

In conclusion, the present invention enables passive detuning at low $B_1$ magnetic fields in an MR device. Transmit pulse distortions are lower, thus IQ is better if passive detune used in imaging. Further, safety is improved, because active control for reducing induced currents in the receiver coils is not required. The rectifier circuit is separated from the PIN diode circuit, and thus the passive detune is more stable. The complete voltage is over the rectifying circuit, so that the passive detune starts to operate with lower $B_1$ values. Dissipation of the PIN diode is lower which increases robustness.

The invention can be implemented in all current and future MRI receiver coils where passive (or active with passive "backup mode") detuning circuits exist. The circuit can particularly be used in integrated neurovascular coils (iNVC) and the anterior coil in 1.5T MR systems and may be used in the same coils in 3T MR systems. The circuit is also suitable to be used in mid-field systems by adjusting the component values accordingly. A typical 16-channel receiver coil has 16-32 detuning circuits each, all of which also incorporate a passive mode, thus enabling the use of the present invention to reduce the power dissipation in the coil.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single or several units may fulfill the functions of several items recited in the claims. The mere fact that certain measures are recited in mutually different dependent claims does not indicate that a combination of these measured cannot be used to advantage.

Any reference signs in the claims should not be construed as limiting the scope.

The invention claimed is:

1. A magnetic resonance imaging system having a transmit phase and a receive phase, the system comprising:
   a) a main magnetic field generator for generating a main magnetic field through an imaging region;
   b) a gradient field generator for generating magnetic field gradients across the main magnetic field;
   c) a radio frequency transmitter coil for selectively transmitting an RF transmit pulse having a resonance frequency spectrum through the imaging region during the transmit phase, exciting nuclei in the imaging region to generate magnetic resonance signals in the resonance frequency spectrum;
   d) an RF receive coil, adapted to resonate in the resonant frequency spectrum, for receiving magnetic resonance signals during the receive phase; and
   e) a detuning circuit for detuning the RF receive coil during the transmit phase, the detuning circuit including
   e1) a resonance circuit including a detuning capacitor and a detuning inductor;
   e2) a PIN diode coupled in series to said detuning inductor and together with said detuning inductor in parallel communication with said detuning capacitor for enabling or disabling the resonance circuit;
   e3) a bias current generating circuit for generating a DC bias current through the PIN diode during the transmit phase including:
   e31) a rectifier coupled, with the same serial polarity, in parallel to the PIN diode,
   e32) a current limiting circuit coupled in series to said rectifier and together with said rectifier in parallel communication with said detuning capacitor for passing a small current through the rectifier, and
   e33) a reactive circuit coupled between the common node of the detuning inductor and the PIN diode and the common node of the rectifier and the current limiting circuit for passing a DC current between said common nodes.

2. The magnetic resonance imaging system as claimed in claim 1, further comprising one or more capacitors coupled between said detuning capacitor and said detuning inductor for blocking a DC current.

3. The magnetic resonance imaging system as claimed in claim 1, wherein said rectifier includes a diode, in particular low-power schottky diode or a triple low-power schottky diode.

4. The magnetic resonance imaging system as claimed in claim 1, wherein said current limiting circuit includes a capacitor, in particular a small-valued capacitor.

5. The magnetic resonance imaging system as claimed in claim 1, wherein said reactive circuit includes an inductor, in particular a large-valued, low-power inductor.

6. The magnetic resonance imaging system as claimed in claim 1, further comprising an RF blocking filter coupled in parallel to said PIN diode.

7. The magnetic resonance imaging system as claimed in claim 6, wherein said RF blocking filter comprises a capacitor coupled in parallel to said PIN diode and one or more inductors coupled between said PIN diode and said capacitor.

8. The magnetic resonance imaging system as claimed in claim 6, wherein said RF blocking filter comprises a current-limiting resistor.

9. A detuning circuit for detuning an RF receive coil during the transmit phase in a magnetic resonance imaging system having a transmit phase and a receive phase, the detuning circuit including
   e1) a resonance circuit including a detuning capacitor and a detuning inductor;
   e2) a PIN diode coupled in series to said detuning inductor and together with said detuning inductor in parallel communication with said detuning capacitor for enabling or disabling the resonance circuit;
   e3) a bias current generating circuit for generating a DC bias current through the PIN diode during the transmit phase including:
   e31) a rectifier coupled, with the same serial polarity, in parallel to the PIN diode,
   e32) a current limiting circuit coupled in series to said rectifier and together with said rectifier in parallel communication with said detuning capacitor for passing a small current through the rectifier, and
   e33) a reactive circuit coupled between the common node of the detuning inductor and the PIN diode and the common node of the rectifier and the current limiting circuit for passing a DC current between said common nodes.

10. A magnetic resonance imaging method having a transmit phase and a receive phase, the method comprising the steps of:
   a) generating a main magnetic field through an imaging region;
   b) generating magnetic field gradients across the main magnetic field;
   c) selectively transmitting an RF transmit pulse having a resonance frequency spectrum through the imaging region during the transmit phase, exciting nuclei in the imaging region to generate magnetic resonance signals in the resonance frequency spectrum;
   d) receiving magnetic resonance signals during the receive phase by a RF receive coil; and
   e) detuning the RF receive coil during the transmit phase, the detuning circuit including
   e1) generating a resonance by a resonance circuit including a detuning capacitor and a detuning inductor;
   e2) enabling or disabling the resonance circuit a PIN diode coupled in series to said detuning inductor and together with said detuning inductor in parallel communication with said detuning capacitor;
   e3) generating a DC bias current through the PIN diode during the transmit phase by a bias current generating circuit including:
   e31) a rectifier coupled, with the same serial polarity, in parallel to the PIN diode,
   e32) a current limiting circuit coupled in series to said rectifier and together with said rectifier in parallel communication with said detuning capacitor for passing a small current through the rectifier, and
   e33) a reactive circuit coupled between the common node of the detuning inductor and the PIN diode and the common node of the rectifier and the current limiting circuit for passing a DC current between said common nodes.

11. A detuning method for detuning an RF receive coil during the transmit phase in a magnetic resonance imaging system having a transmit phase and a receive phase, the detuning method including the steps of
   e1) generating a resonance by a resonance circuit including a detuning capacitor and a detuning inductor;
   e2) enabling or disabling the resonance circuit a PIN diode coupled in series to said detuning inductor and together with said detuning inductor in parallel communication with said detuning capacitor;
   e3) generating a DC bias current through the PIN diode during the transmit phase by a bias current generating circuit including:
   e31) a rectifier coupled, with the same serial polarity, in parallel to the PIN diode,
   e32) a current limiting circuit coupled in series to said rectifier and together with said rectifier in parallel communication with said detuning capacitor for passing a small current through the rectifier, and
   e33) a reactive circuit coupled between the common node of the detuning inductor and the PIN diode and the common node of the rectifier and the current limiting circuit for passing a DC current between said common nodes.

12. A non-transitory computer readable medium comprising a computer program for detuning an RF receive coil during the transmit phase in a magnetic resonance imaging system having a transmit phase and a receive phase, the computer program including instructions for
   e1) generating a resonance by a resonance circuit including a detuning capacitor and a detuning inductor;
   e2) enabling or disabling the resonance circuit a PIN diode coupled in series to said detuning inductor and together with said detuning inductor in parallel communication with said detuning capacitor;
   e3) generating a DC bias current through the PIN diode during the transmit phase by a bias current generating circuit including:
   e31) a rectifier coupled, with the same serial polarity, in parallel to the PIN diode,
   e32) a current limiting circuit coupled in series to said rectifier and together with said rectifier in parallel communication with said detuning capacitor for passing a small current through the rectifier, and
   e33) a reactive circuit coupled between the common node of the detuning inductor and the PIN diode and the common node of the rectifier and the current limiting circuit for passing a DC current between said common nodes.

* * * * *